United States Patent [19]

Hidano

[11] Patent Number: 5,171,972
[45] Date of Patent: Dec. 15, 1992

[54] HEAT TREATING FURNACE

[75] Inventor: Masaru Hidano, Yokohama, Japan

[73] Assignee: Tokyo Electron Sagami Limited, Kanagawa, Japan

[21] Appl. No.: 766,222

[22] Filed: Sep. 27, 1991

[30] Foreign Application Priority Data

Sep. 28, 1990 [JP] Japan .................. 2-261816

[51] Int. Cl.$^5$ .............................................. F27B 5/14
[52] U.S. Cl. .................................................. 219/390
[58] Field of Search ........................ 219/390, 405, 411

[56] References Cited

U.S. PATENT DOCUMENTS

| | | | |
|---|---|---|---|
| 3,240,915 | 3/1966 | Carter | 219/405 |
| 3,387,078 | 6/1968 | Montgomery | 219/390 |
| 3,972,682 | 8/1976 | Stephens | 219/390 |
| 4,167,914 | 9/1979 | Toole | 219/390 |
| 4,699,084 | 10/1987 | Wilson | 219/390 |

Primary Examiner—Teresa J. Walberg
Attorney, Agent, or Firm—Oblon, Spivak, McClelland, Maier & Neustadt

[57] ABSTRACT

A heat treating furnace has a reaction tube for accommodating an object to be treated, a heating device arranged to surround the reaction tube, a heat-insulating member arranged outside the heating device, a tubular member arranged outside the heat-insulating member, and a coolant circulating pipe arranged in a space between the tubular member and the heat-insulating member. According to the heat treating furnace of the present invention, a heat treatment can be performed while accurately performing temperature control.

16 Claims, 5 Drawing Sheets

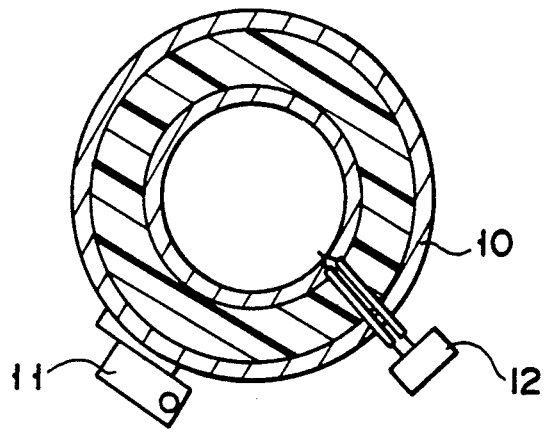
F I G. 1
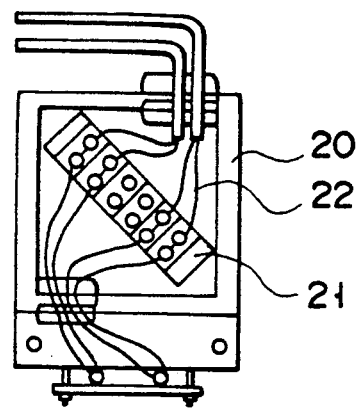
F I G. 2
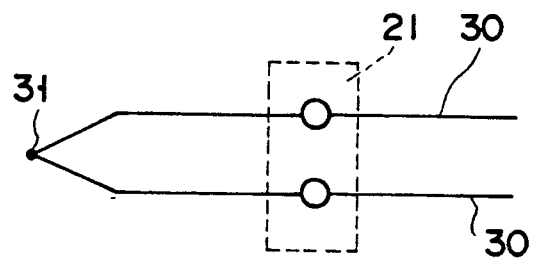
F I G. 3

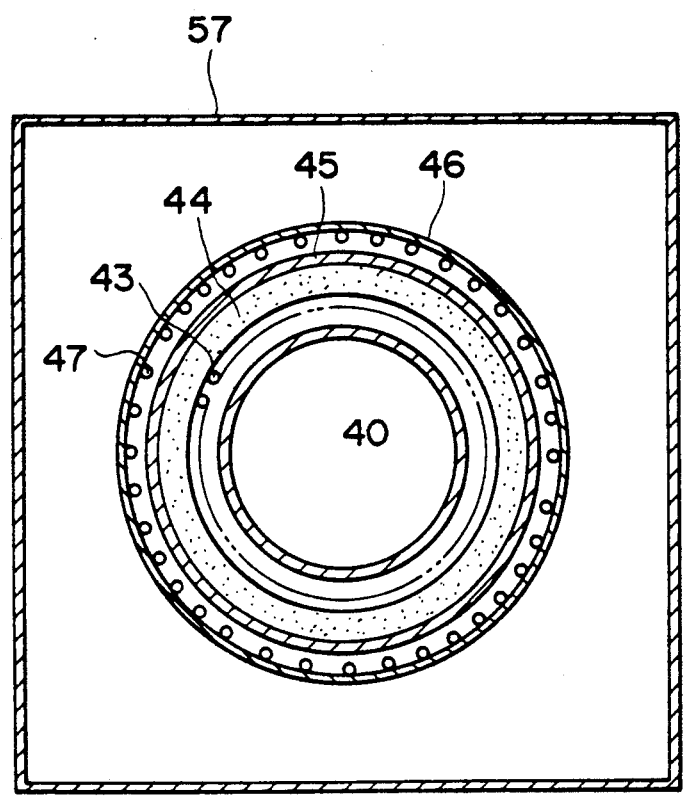
F I G. 5

HEAT TREATING FURNACE

BACKGROUND OF THE INVENTION

1. Field of the Invention

The present invention relates to a heat treating furnace and, more particularly, to a heat treating furnace capable of performing a heat treatment while protecting a measuring equipment and the like provided to the heat treating furnace.

2. Description of the Related Art

A furnace chamber of a heat treating furnace used for various heat treatments of, e.g., a semiconductor wafer, has a process tube for accommodating a semiconductor wafer as an object to be treated, a heater wire as a heating member surrounding the process tube, and a heat-insulating member arranged outside the heater wire.

In such a heat treating furnace, when, e.g., the interior of the process tube is to be kept at about 1,200° C., the outer surface of the process tube is heated to about 300° C. and has a rather high temperature. For this reason, it is required to prevent heat from being conducted to the outside of the furnace chamber to adversely affect a surrounding equipment.

Conventionally, each of Published Examined Japanese Utility Model Application No. 53-48589 and Published Unexamined Japanese Utility Model Application No. 49-39044 discloses a heat treating furnace in which a cooling fan is arranged around a furnace chamber to forcibly cool the furnace chamber.

As shown in FIG. 1, a terminal 11 and a junction box which houses a temperature measuring equipment are mounted around an outer tube 10 of the furnace chamber. In this case, the junction box 12 is mounted by an Al screw having good heat dissipation. Usually, the junction box 12 has a box-like main body 20 made of, e.g., stainless steel, and a terminal board 21 made of, e.g., a phenol resin, and housed in the box-like main body 20, as shown in FIG. 2. Compensating wires 22 are connected to the junction box 12 to constitute a thermocouple. A detecting section of the thermocouple is arranged inside the furnace chamber in order to measure a temperature in the furnace chamber. That is, as shown in FIG. 3, two compensating wires 30 form a detecting section 31 at one end each thereof and compensating contacts 21 on a terminal board 21 of the junction box 12, and are connected to a controller (not shown).

When the temperature in the furnace is stably kept at a processing temperature, heat is usually dissipated from the outer tube to the peripheral portion of the furnace body. Since the junction box is mounted on the outer tube, heat is conducted from the outer tube to the junction box through the screw which fixes the junction box. As a result, the junction box is heated. At the same time, the terminal board inside the junction box is also heated. In a conventional heat treating furnace, when the temperature in the furnace is 1,200° C., the temperature of the outer tube becomes 280° C., and the temperature in the junction box becomes about 102° C.

The compensating contacts are formed on the terminal board of the junction box. Hence, when the temperature of the terminal board is increased, a temperature difference occurs. As a result, an actual temperature becomes higher than a set temperature by a value corresponding to the difference. Then, when a temperature profile and the like are input to the controller and temperature control is to be performed based on the temperature profile, accurate temperature control cannot be performed.

The heat-insulating temperature of the phenol resin as the material of the terminal board is about 85° C. Therefore, when the temperature of the junction box exceeds this value, the terminal board may be damaged.

In this manner, in order to prevent various wirings and measuring equipments arranged around the furnace chamber from being adversely affected by the heat, the temperature around the furnace chamber is preferably set at about 50° C. or less. With the conventional heat treating furnace, however, such high cooling performance cannot be expected. As the cooling performance is insufficient, the temperature around the furnace chamber cannot be lowered to 50° C. or less. Accordingly, an adverse effect of the heat on the various wirings and measuring equipments arranged around the furnace chamber cannot be avoided.

The manufacture of a semiconductor wafer is performed in a quiet atmosphere in a clean room. For this purpose, convection of air and the like need be avoided as much as possible. However, in the conventional heat treating furnace of the forced air-cooling type, convection occurs and particles may scatter in the clean room.

SUMMARY OF THE INVENTION

It is an object of the present invention to provide a heat treating furnace which can maintain a temperature around a furnace chamber to such a degree not adversely affecting various wirings and measuring equipments arranged around the furnace chamber by heat, and which can perform a heat treatment without causing convection of air.

This object is achieved by a heat treating furnace having a reaction tube for accommodating an object to be treated, heating means arranged to surround the reaction tube, a heat-insulating member arranged outside the heating means, a tubular member arranged outside the heat-insulating member, and a coolant circulating pipe arranged in a space between the tubular member and the heat-insulating member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view of a conventional heat treating furnace;

FIG. 2 is a schematic view for explaining a junction box mounted on a quartz tube of the heat treating furnace;

FIG. 3 is a schematic diagram for explaining wiring of a thermocouple;

FIG. 5 is a cross-sectional view taken along the line V-V' of the heat treating furnace shown in FIG. 4;

DETAILED DESCRIPTION OF THE PREFERRED EMBODIMENTS

Preferred embodiments of the present invention will be described with reference to the accompanying drawings.

Figure 4:
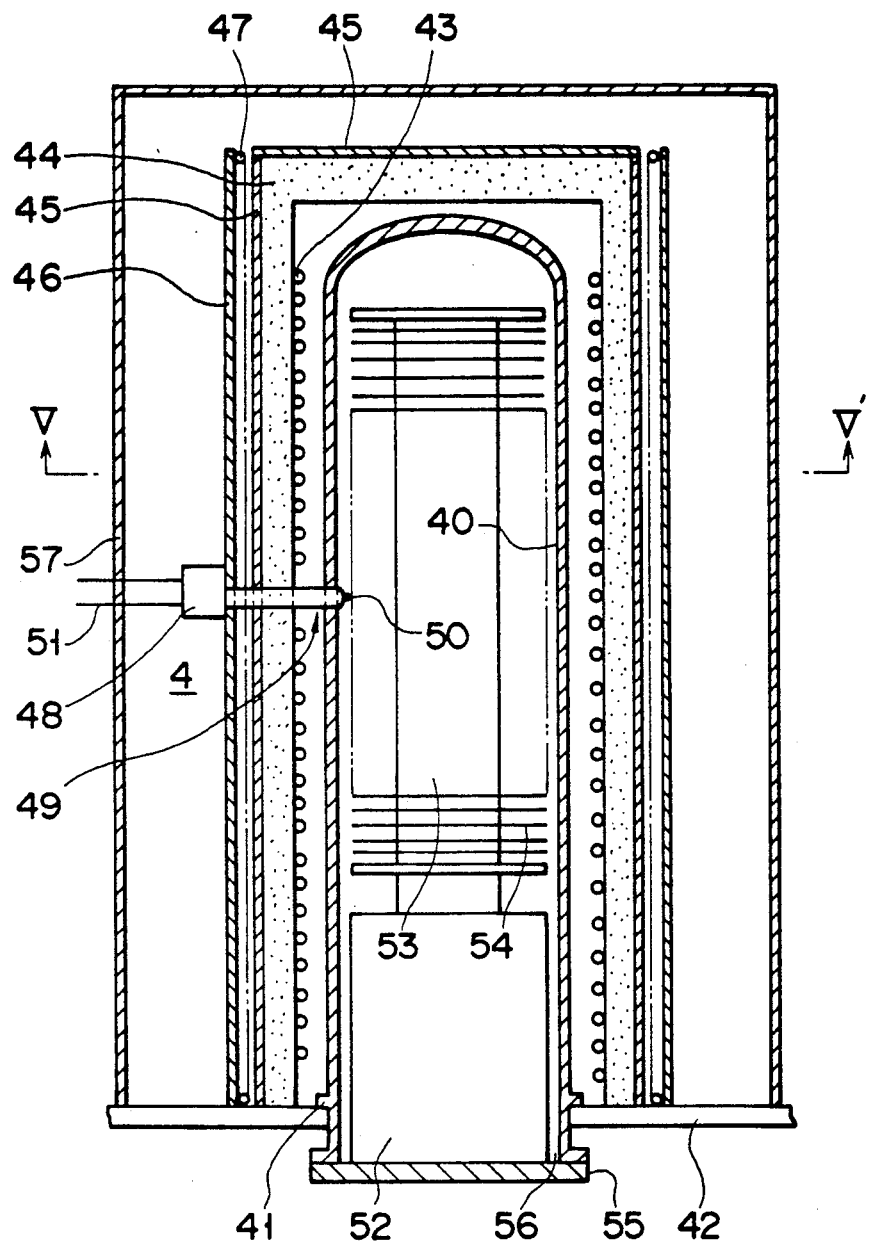
FIG. 4 is a longitudinal sectional view showing a heat treating furnace according to an embodiment of the present invention.

FIG. 4 is a longitudinal sectional view of a heat treating furnace according to an embodiment of the present invention, and FIG. 5 is a cross-sectional view of the heat treating furnace shown in FIG. 4.

This embodiment exemplifies a vertical heat treating furnace used in the manufacture of a semiconductor wafer.

Referring to FIG. 4, reference numeral 40 denotes a process tube made of a refractory material, e.g., quartz. A flange portion 41 is formed on the lower portion of the process tube 40. A base plate 42 made of, e.g., stainless steel supports the flange portion 41 to keep the process tube 40 upright.

As a heating member, e.g., a resistance heating heater 43 surrounds the process tube 40. The heater 43 employs a 3-zone or a 5-zone method. That is, the heater 43 is divided into three or five zones, i.e., the top, center, and bottom of a furnace chamber 4, and can heat the respective zones to 500° to 1,200° C. independently of each other. A heat-insulating member 44 is arranged outside the heater 43 to prevent heat generated by the heater 43 from being conducted to the outside of the furnace chamber 4. A cylindrical inner shell 45 made of a metal, e.g., stainless steel, is arranged outside the heat-insulating member 44. A cylindrical outer shell 46 made of a metal, e.g., a stainless steel, is arranged outside the inner shell 45 at a predetermined spacing. A space is defined between the inner and outer shells 45 and 46.

Figure 6:
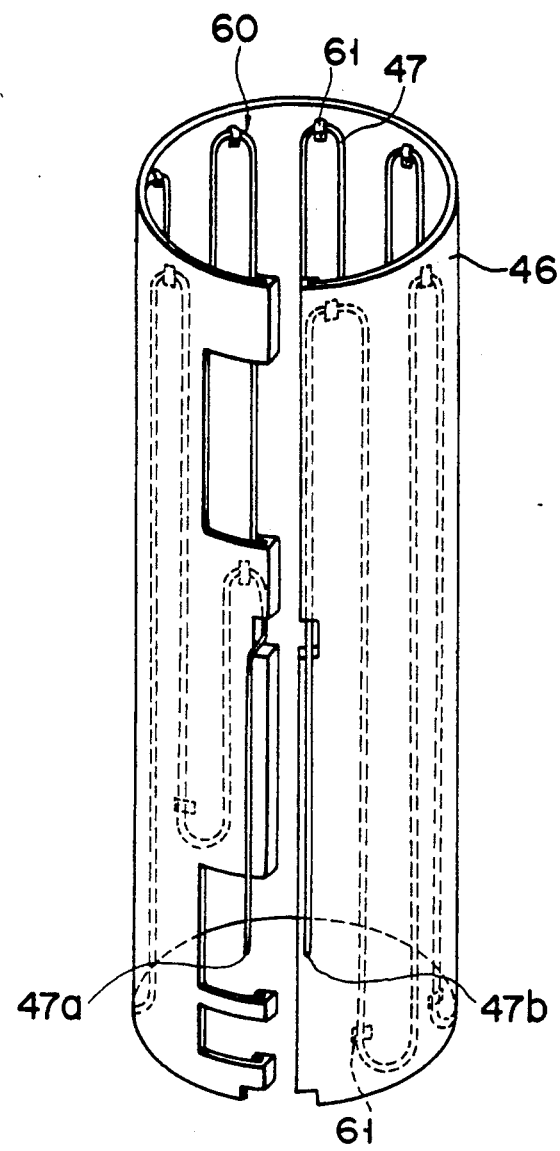
FIG. 6 is a perspective view showing a cooling member of the heat treating furnace of the present invention which has a circulating pipe.

A circulating pipe 47 for circulating a coolant is arranged between the inner and outer shells 45 and 46. As the coolant, a tap water of a temperature of about 20° C., cooled water, or the like can be used. As the circulating pipe 47, a copper pipe, a stainless pipe, or the like can be used. As shown in FIG. 6, the circulating pipe 47 is mounted on the inner circumferential surface of the outer shell 46 by support members 61 made of, e.g., stainless steel, so as to have folded portions 60 in the vicinities of two open ends of the outer shell 46. In this case, the coolant circulates in the longitudinal direction of the outer shell 46. To circulate the coolant in the circulating pipe 47, the coolant is supplied from a coolant supply port 47a of the circulating pipe 47 and is discharged from a coolant discharge port 47b of the circulating pipe 47

The support members 61 are mounted on the respective folded portions 60 of the circulating pipe 47 in the vicinity of the one open end of the outer shell 46, and mounted on the linear portions of the circulating pipe 47 in the vicinity of the other open end of the outer shell 46 in order to avoid the folded portions 60. In this manner, since all the folded portions 60 are not held by the support members 61 in the vicinities of the two open ends, the circulating pipe 47 can cope with a change in size of the circulating pipe 47 or the outer shell 46 by thermal expansion or shrinkage. The outer shell 46 is formed in the following manner. The circulating pipe 47 is mounted on a single metal sheet by the support members 61, the metal sheet is rolled to have a cylindrical shape, and the metal sheet is fixed on the outer side of the inner shell 45 by using metal bands.

A junction box 48 for housing a terminal board is mounted on the outer surface of the outer shell 46 by an aluminum screw. A detecting section 50 of a thermocouple 49 is arranged inside the process tube 40. Compensating wires 51 extend through the process tube 40, the heat-insulating member 44, and the inner and outer shells 45 and 46 and are connected to an external controller through compensating contacts in the junction box 48.

A wafer boat 53 made of a refractory material, e.g., quartz, and placed on a heat-insulating cylinder 52 is housed in the process tube 40. The wafer boat 53 is detachable from the heat-insulating cylinder 52. For example, 150 semiconductor wafers 54 as objects to be treated can be horizontally arranged in the wafer boat 53 at predetermined intervals therebetween. The heat-insulating cylinder 52 is mounted on a flange cap 55, and the flange cap 55 can be vertically moved by an elevator arm (not shown). With this arrangement, the wafer boat 53 housing the semiconductor wafers 54 can be loaded and unloaded. To load the wafer boat 53, a wafer boat insertion hole 56 in the lower portion of the process tube 40 can be sealed by the flange cap 55.

The furnace chamber 4 is constituted in this manner. A casing 57 is arranged outside the furnace chamber 4, and the furnace chamber 4 is sealed by the casing 57 and the base plate 42. An air pipe and various wirings (neither are shown) are arranged between the casing 57 and the furnace chamber 4. The heat treating furnace of the present invention is constituted in the manner as described above.

When a process gas is supplied to the process tube 40 from a process gas supply source (not shown), various processing operations can be performed for the semiconductor wafers 54. Heat generated by the heater 43 during processing is conducted to the inner shell 45 through the heat-insulating member 44. The heated inner shell 45 is cooled by circulating the coolant through the circulating pipe 47. That is, heat exchange is performed between the coolant circulating in the circulating pipe 47 and the heated inner shell 45. Since the circulating pipe 47 cooled by the coolant comes in contact with the outer shell 46, the outer shell 46 is cooled by heat conduction. The heat conduction between the outer shell 46 and the inner shell 45 and between the circulating pipe 47 and the inner shell 45 is performed by the convection of air. Hence, the inner and outer shells 45 and 46 is cooled uniformly. Hence, heat conduction to the outer shell 46 is suppressed. A temperature increase outside the outer shell 46 can be suppressed to set the temperature around the furnace chamber 4 to about 50° C. or less. As a result, the air pipe and the junction box 48 arranged around the furnace chamber 4 can be protected from heat. For this reason, the heat treatment can be performed while accurately performing temperature control.

According to the heat treating furnace of the present invention, since cooling is performed by circulating the coolant in the circulating pipe 47, convection of the atmospheric air does not occur, unlike with a heat treating furnace of the forced air-cooling type. As a result, particles are prevented from scattering in the clean room to adversely affect the manufacture of the semiconductor wafer.

Figure 7:
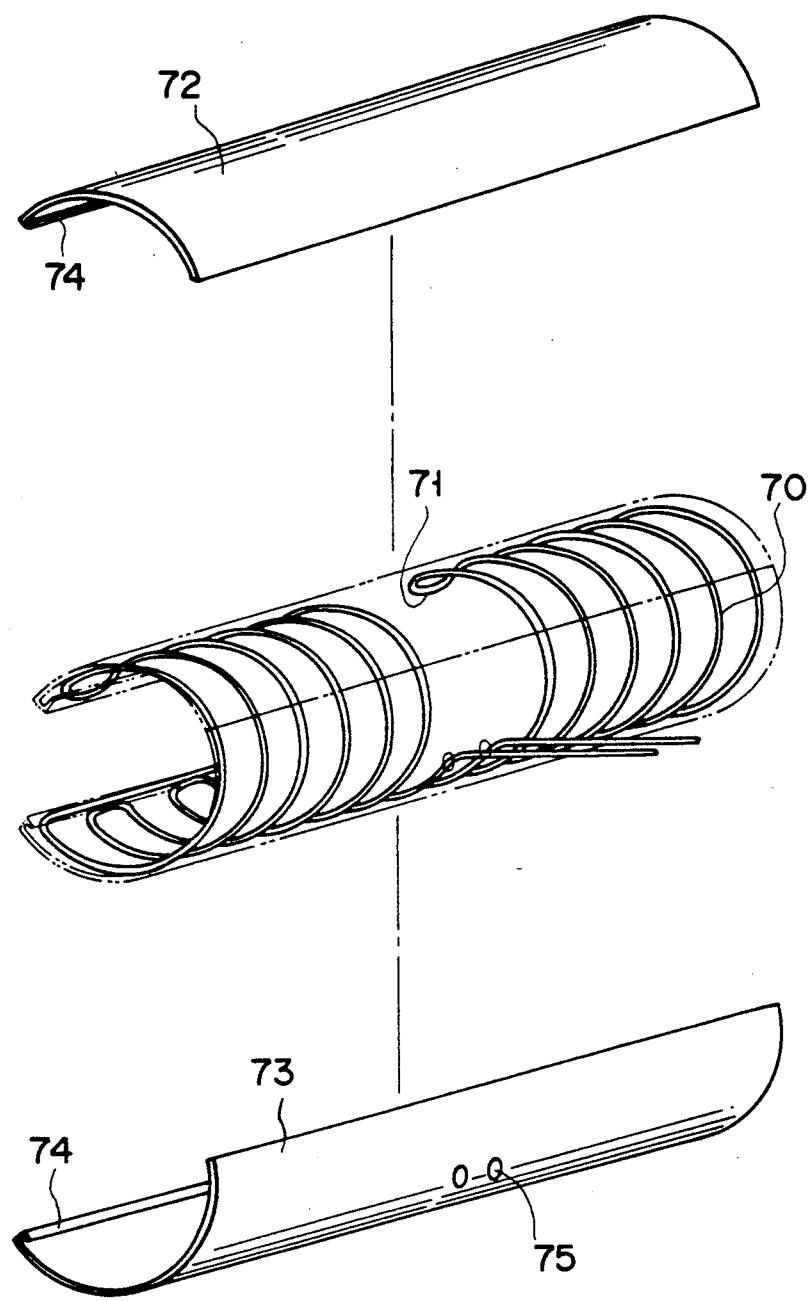
FIG. 7 is a perspective view showing a cooling member used in a heat treating furnace according to another embodiment of the present invention.

FIG. 7 is a schematic view showing a circulating pipe used in a heat treating furnace according to another embodiment of the present invention.

This embodiment exemplifies a horizontal heat treating furnace.

Referring to FIG. 7, reference numeral 70 denotes a circulating pipe for circulating a coolant. The circulating pipe 70 is made of a single copper pipe and has folded portions 71 to be of a ring-like shape. In this case, the coolant circulates in the circumferential direction of the outer shell.

The outer shell is made from two semi-cylindrical metal sheets 72 and 73 in the following manner. One end of the metal sheet 72 is welded or screwed with one end of the metal sheet 73 to form a substantially cylindrical shape. A gutter portion 74 for housing the folded portions 71 of the circulating pipe 70 is formed on the other side of each of the metal sheets 72 and 73 which is not bonded. To mount the circulating pipe 70 in the metal plates 72 and 73, the folded portions 71 of the ring-like circulating pipe 70 are fitted in the gutter portions 74 of the corresponding metal sheets 72 and 73, and the portions of the metal sheets 72 and 73 that are to be bonded to each other are abutted to each other and welded or screwed to be integrally formed. In this case, end portions of the circulating pipe 70 are inserted in holes 75 which are formed in the circumferential surface of the metal sheet 73 for receiving the circulating pipe 70. Then, the outer shell mounted with the circulating pipe 70 is placed over an inner shell covering a heat-insulating member and is fixed with metal bands.

The horizontal heat treating furnace having such a circulating pipe has a similar effect to that of the vertical heat treating furnace described above.

The present invention is not limited to the embodiments described above and various changes and modifications may be made not departing from the spirit and scope of the invention.

For example, when no inner shell is provided outside the heat-insulating member and an outer shell mounted with a circulating pipe is directly arranged outside the heat-insulating member, the same effect as that of the present invention can be obtained. If a multiple of cooling fins 80 (FIG. 7) made of aluminum are mounted on the circulating pipe, the cooling efficiency is increased.

The types of coolants circulating in the circulating pipe may be changed in accordance with processing temperatures, and the circulating speed of the coolant may be changed to set the temperature around the furnace body to about 50° C. or less.

The circulating speed of the coolant may be changed in accordance with temperature information from the temperature measuring equipments to set the portion around the furnace chamber to about 50° C. or less. The circulating pipe which lies in a zigzag line may be used as cooling means, and is fixed to the inner shell using the support members. In this case, since the circulating pipe comes in contact with the inner shell directly, the inner shell is cooled with the circulating pipe efficiently and the temperature of the outer shell is lowered.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat processing furnace comprising:
   a vertical reaction tube for accommodating an object to be treated;
   heating means arranged to surround said vertical reaction tube;
   a heat-insulating member arranged outside said heating means;
   a first tubular member arranged outside said heat-insulating member;
   a second tubular member arranged outside said first tubular member; and
   a coolant circulating pipe arranged in a space between said first tubular member and said second tubular member;
   wherein:
   said coolant circulating pipe is bent in a zigzag fashion in a vertical direction of the vertical reaction tube and comprises bent portions, said bent portions of the coolant circulating pipe being located at upper and lower ends of the vertical reaction tube and arranged in a circumferential direction of the vertical reaction tube.

2. The furnace according to claim 1, wherein said coolant circulating pipe is arranged inside the second tubular member beforehand.

3. The furnace according to claim 1, wherein said second tubular member is discontinuous in the circumferential direction of the vertical reaction tube and comprises a gap which extends in the longitudinal direction thereof.

4. The furnace according to claim 1, wherein a box accommodating a temperature measuring terminal is mounted on an outer surface of said second tubular member.

5. The furnace according to claim 1, wherein said coolant circulating pipe is made of one of copper and stainless steel.

6. The furnace according to claim 1, wherein said coolant is water whose temperature is around 20° C.

7. The furnace according to claim 1, wherein said coolant circulating pipe is prefabricated in a zigzag fashion and provided inside the second tubular member beforehand.

8. A heat processing furnace comprising:
   a lateral reaction tube for accommodating an object to be treated;
   heating means arranged to surround said lateral reaction tube;
   a heat-insulating member arranged outside said heating means;
   a first tubular member arranged outside said heat-insulating member;
   a second tubular member arranged outside said first tubular member; and
   a coolant circulating pipe arranged in a space between said first tubular member and said second tubular member;
   wherein:
   said coolant circulating pipe is bent in a zigzag fashion in a circumferential direction of the lateral reaction tube and comprises bent portions, said bent portions of the coolant circulating pipe being arranged in a longitudinal direction of the lateral reaction tube.

9. The furnace according to claim 8, wherein said coolant circulating pipe is arranged inside the second tubular means beforehand.

10. The furnace according to claim 8, wherein said second tubular member is discontinuous in the circumferential direction of the lateral reaction tube and comprises a gap which extends in the longitudinal direction thereof.

11. The furnace according to claim 8, wherein a box housing a temperature measuring terminal is mounted on an outer surface of said second tubular member.

12. The furnace according to claim 8, wherein said coolant circulating pipe is made of one of copper and stainless steel.

13. The furnace according to claim 8, wherein said coolant is water whose temperature is around 20° C.

14. The furnace according to claim 8, wherein said coolant circulating pipe is provided with a plurality of cooling fins.

15. The furnace according to claim 14, wherein said cooling fins are made of aluminum.

16. The furnace according to claim 8, wherein said coolant circulating pipe is prefabricated in a zigzag fashion and provided inside the second tubular member beforehand.

* * * * *